United States Patent
Bolotnikov et al.

(10) Patent No.: US 10,600,649 B2
(45) Date of Patent: Mar. 24, 2020

(54) SYSTEMS AND METHOD FOR CHARGE BALANCED SEMICONDUCTOR POWER DEVICES WITH FAST SWITCHING CAPABILITY

(71) Applicant: General Electric Company, Schenectady, NY (US)

(72) Inventors: Alexander Viktorovich Bolotnikov, Niskayuna, NY (US); Peter Almern Losee, Clifton Park, NY (US); Reza Ghandi, Niskayuna, NY (US); David Alan Lilienfeld, Niskayuna, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 15/953,037

(22) Filed: Apr. 13, 2018

(65) Prior Publication Data

US 2019/0088479 A1 Mar. 21, 2019

Related U.S. Application Data

(60) Provisional application No. 62/561,592, filed on Sep. 21, 2017.

(51) Int. Cl.
| | |
|---|---|
| H01L 21/04 | (2006.01) |
| H01L 29/36 | (2006.01) |
| H01L 29/06 | (2006.01) |
| H01L 29/78 | (2006.01) |
| H01L 29/66 | (2006.01) |
| H01L 29/16 | (2006.01) |
| H01L 29/10 | (2006.01) |

(52) U.S. Cl.
CPC ...... *H01L 21/0465* (2013.01); *H01L 29/0634* (2013.01); *H01L 29/36* (2013.01); *H01L 29/66068* (2013.01); *H01L 29/7802* (2013.01); *H01L 29/7811* (2013.01); *H01L 29/0623* (2013.01); *H01L 29/1095* (2013.01); *H01L 29/1608* (2013.01)

(58) Field of Classification Search
None
See application file for complete search history.

(56) References Cited

U.S. PATENT DOCUMENTS

| 5,998,833 A | 12/1999 | Baliga |
| 6,274,904 B1 | 8/2001 | Tihanyi |

(Continued)

OTHER PUBLICATIONS

Wada, Keiji, et al.; "Fast Switching 4H-SiC V-groove Trench MOSFETs with Buried P+ Structure", 2014 IEEE 26th International Symposium on Power Semiconductor Devices & IC's (ISPSD), pp. 225-228, Jun. 15-19, 2014, Waikoloa, HI.

(Continued)

*Primary Examiner* — Lex H Malsawma
(74) *Attorney, Agent, or Firm* — Fletcher Yoder, P.C.

(57) ABSTRACT

A method of manufacturing a semiconductor device including performing a first implantation in a semiconductor layer via ion implantation forming a first implantation region and performing a second implantation in the semiconductor layer via ion implantation forming a second implantation region. The first and second implantation overlap with one another and combine to form a connection region extending into the semiconductor layer by a predefined depth.

25 Claims, 10 Drawing Sheets

(56) References Cited

U.S. PATENT DOCUMENTS

| | | |
|---|---|---|
| 6,344,676 B1 | 2/2002 | Yun et al. |
| 7,001,806 B2 | 2/2006 | Tilke et al. |
| 8,692,324 B2 | 4/2014 | Korec et al. |
| 9,087,893 B2 | 7/2015 | Onishi et al. |
| 9,236,470 B2 | 1/2016 | Hebert et al. |
| 10,243,039 B2 * | 3/2019 | Bolotnikov ........... H01L 21/046 |
| 2002/0117715 A1 | 8/2002 | Oppermann et al. |
| 2008/0014693 A1 | 1/2008 | Matocha |
| 2012/0080752 A1 | 4/2012 | Chou et al. |
| 2013/0256846 A1 | 10/2013 | Huang et al. |
| 2014/0117450 A1 | 5/2014 | Anderson et al. |
| 2015/0333169 A1 * | 11/2015 | Willmeroth ......... H01L 29/7809 257/329 |
| 2016/0211365 A1 * | 7/2016 | Shea .................... H01L 29/0634 |
| 2016/0260823 A1 | 9/2016 | Udrea et al. |
| 2016/0293692 A1 * | 10/2016 | Sakata ................ H01L 29/0634 |
| 2016/0380059 A1 | 12/2016 | Losee et al. |
| 2017/0278924 A1 | 9/2017 | Bolotnikov et al. |
| 2018/0076315 A1 * | 3/2018 | Maeta ................ H01L 29/7811 |

OTHER PUBLICATIONS

International Search Report and Written Opinion issued in connection with corresponding PCT Application No. PCT /US2018/ 043051 dated Nov. 6, 2018.

\* cited by examiner

SYSTEMS AND METHOD FOR CHARGE BALANCED SEMICONDUCTOR POWER DEVICES WITH FAST SWITCHING CAPABILITY

CROSS REFERENCE TO RELATED APPLICATION

This application claims priority to and benefit of U.S. Provisional Patent Application No. 62/561,592, entitled "SYSTEMS AND METHODS FOR CHARGE BALANCED SUPER-JUNCTION SEMICONDUCTOR POWER DEVICES WITH FAST SWITCHING CAPABILITY", filed Sep. 21, 2017, which is herein incorporated by reference in its entirety.

STATEMENT REGARDING FEDERALLY SPONSORED RESEARCH & DEVELOPMENT

This invention was made with Government support under contract number DEAR00000674 awarded by the Government of the United States of America. The Government has certain rights in the invention.

BACKGROUND

The subject matter disclosed herein relates to semiconductor power devices and, more specifically, to charge balanced (CB) semiconductor power devices.

For semiconductor power devices, super-junction (also referred to as charge balance) designs offer several advantages. For example, CB devices demonstrate reduced resistance and reduced conduction losses per unit area relative to traditional unipolar device designs. However, the switching speed of CB devices utilizing floating regions depends on the recombination-generation rates of the carriers in the semiconductor material. For some semiconductor materials, such as wide band gap materials, the recombination-generation rates may be relatively low and may result in relatively low switching speeds. To increase the recombination-generation rates and the switching speed of such CB devices, point defects may be introduced into the semiconductor material. However, the point defects may increase the leakage current of the device.

BRIEF DESCRIPTION

Certain embodiments commensurate in scope with the original claims are summarized below. These embodiments are not intended to limit the scope of the claims, but rather these embodiments are intended only to provide a brief summary of possible forms of the claimed subject matter. Indeed, the claims may encompass a variety of forms that may be similar to or different from the embodiments set forth below.

In one embodiment, a method of manufacturing a semiconductor device includes performing a first implantation in a semiconductor layer via ion implantation and performing a second implantation in the semiconductor layer via ion implantation. The first and second implantation overlap with one another and combine to form a connection region extending through the semiconductor.

In a second embodiment, a CB device includes a device layer having a first conductivity type, a first charge balance (CB) layer having the first conductivity type disposed adjacent to the device layer, a first connection region having the second conductivity type comprising a region where a first implantation and a second implantation overlap with one another, a first region formed by the first implantation and is adjacent to the connection region, and a second region formed by the second implantation and is adjacent the connection region, opposite the first region. The device layer comprises a top region having a second conductivity type disposed in a top surface of the device layer. The first CB layer comprises a first plurality of charge balance (CB) regions having the second conductivity type. The first connection region extends from the top region of the device layer to at least a first CB region of the first plurality of CB regions of the first CB layer.

In a third embodiment, a CB device includes at least one epitaxial (epi) layer having a first conductivity type that includes a plurality of charge balance (CB) regions having a second conductivity type to form at least one charge balance (CB) layer, a top epitaxial layer having the first conductivity type disposed adjacent to the at least one CB layer to form a device layer, a connection region having the second conductivity type formed by a first implantation and a second implantation overlap with one another, a first region is adjacent the connection region and formed by the first implantation, and a second region is adjacent the connection region and formed by the second implantation, opposite the first region. A thickness of each of the plurality of CB regions is less than a thickness of the at least one CB layer. The device layer includes a top region having the second conductivity type. The connection region extends from the top region of the device layer to at least one of the plurality of CB regions of the at least one CB layer.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
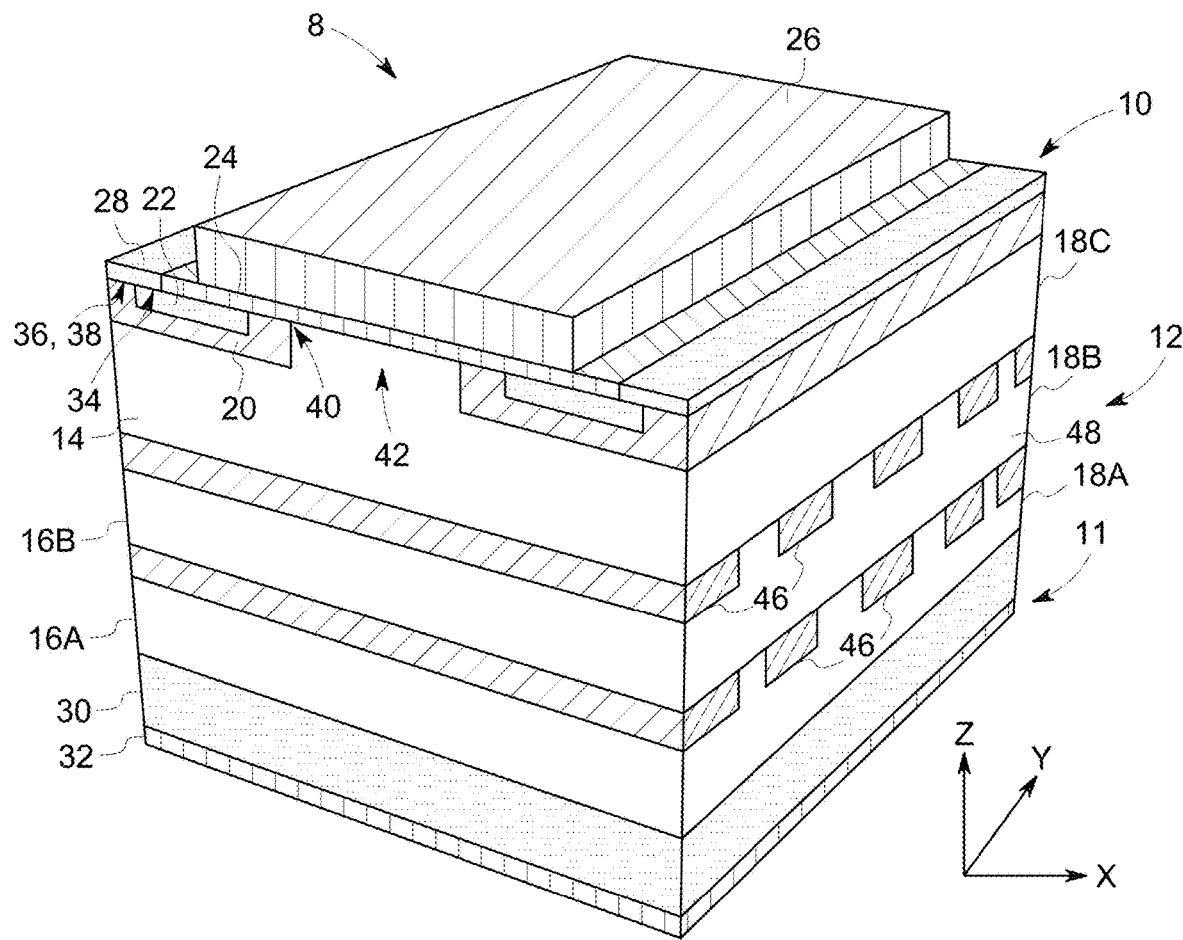
FIG. 1 illustrates a perspective view of a of CB metal-oxide-semiconductor field-effect transistor (MOSFET) device that includes a plurality of CB layers, each having a plurality of CB regions, in accordance with an embodiment.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of layers, unless the context clearly dictates otherwise. Further, as used herein, the term "disposed on" refers to layers disposed directly in contact with each other or indirectly by having intervening layers there between, unless otherwise specifically indicated. The term "adjacent" as used herein means that the two layers are disposed contiguously and are in direct contact with each other.

In the present disclosure, when a layer/region is described as "on" another layer or substrate, it is to be understood that the layers/regions can either be directly contacting each other or have one (or more) layer or feature between the layers and regions. Further, the term "on" describes the relative position of the layers/regions to each other and does not necessarily mean "on top of" since the relative position above or below depends upon the orientation of the device to the viewer. Moreover, the use of "top," "bottom," "above," "below," "upper", and variations of these terms is made for convenience, and does not require any particular orientation of the components unless otherwise stated. With this in mind, as used herein, the terms "lower," "middle," or "bottom" refer to a feature (e.g., epitaxial layer) that is relatively nearer the substrate layer, while the terms "top" or "upper" refer to the particular feature (e.g., epitaxial layer) that is relatively the farthest from the substrate layer.

Present embodiments are directed toward designs and methods of manufacturing vertical semiconductor charge-balance (CB) devices, which also may be referred to as semiconductor super-junction (SJ) devices. The disclosed designs and methods are useful in the manufacture of CB devices, such as metal-oxide-semiconductor field-effect transistors (MOSFETs), junction field effect transistors (JFETs), bipolar junction transistors (BJTs), diodes, as well as other devices that may be useful for medium-voltage (e.g., 2 kV-10 kV) and high-voltage (e.g., greater than or equal to 10 kV or 10 kV-20 kV) power conversion related applications. Further, the disclosed designs and methods are useful in the manufacture of wide band gap CB devices, such as silicon carbide (SiC) CB devices, gallium nitride CB devices, diamond CB devices, aluminum nitride CB devices, boron nitride CB devices, as well as other CB devices manufactured using one or more wide band gap semiconductor materials.

As discussed below, the disclosed CB devices include multi-layered drift regions implemented using repeated epitaxial growth and dopant implantation steps. As used herein, the term "multi-layered," as well as references to a particular number of layers (e.g., "two-layered," "three-layered," "four-layered,"), refers to the number of epitaxial (epi) layers of the CB device. The disclosed multi-layered drift region designs include charge balance (CB) layers having a first conductivity type (e.g., n-type CB layers). Further, each of these CB layers includes a plurality of charge balance (CB) regions, which are discrete, buried, implanted regions of doping having the opposite conductivity type as the remainder of the CB layer that reshape the electrical field in the active area of a CB device. These CB regions are described herein as "buried" in that they are disposed within the lower epi layers (e.g., within a CB layer that is disposed between the upper/device epi layer and the substrate layer) of the CB device and are not in contact with a device terminal. For the disclosed CB device embodiments, as discussed below, these CB layer designs enable low conduction losses and high blocking voltages while still maintaining a relatively simple fabrication process.

Further, as discussed below, the disclosed CB devices include connection regions of the same conductivity type as the CB regions, and the connection regions generally provide an electrical connection (e.g., a vertical connection) between the CB regions of the CB layers and a highly doped region (e.g., a top region, a second conductivity region, a well region, body contact region, a junction barrier region, a body region, or termination region) of the same conductivity type as the CB regions that is disposed on or proximate to a top surface (e.g., farthest from the substrate layer) of the device. Fast switching speeds and high blocking voltages may be achieved via connection regions that are narrow and deep, connecting the CB regions. In present embodiments, the connection region may be formed by two intentionally misaligned implants of doped material. As such, when the CB device transitions from an off-state to on-state, carriers are able to flow directly from the highly doped region(s) to the CB regions via the connection regions. Conversely, during a transition from on-state to off-state, carriers are able to flow directly from the CB regions to the highly doped region via the connection regions. As a result, the switching performance of disclosed CB devices is independent of the recombination-generation rates of the carriers, thereby offering increased switching speeds and reduced switching and dynamic on-resistance losses compared to CB devices with floating CB regions having the same current/voltage rating, without substantially increasing the leakage current. While the following discussion relates to MOSFETs, the disclosed designs and methods may also be applied to junction field effect transistors (JFETs), bipolar junction transistors (BJTs), diodes (e.g., junction barrier Schottky (JBS) diodes, merged PiN Schottky (MPS) diodes, etc.), as well as other CB devices that may be useful for medium-voltage (e.g., 2 kV-10 kV) and high-voltage (e.g., greater than or equal to 10 kV or 10 kV-20 kV) power conversion related applications.

FIG. 1 is a perspective view of an embodiment of a CB MOSFET device 8 having a drift region 12 that includes a device layer 14 disposed on a number of charge balance (CB) layers 16. It may be appreciated that, in order to more clearly illustrate certain components of the device 8, as well as other devices discussed below, certain commonly understood design elements (e.g., top metallization, passivation, edge termination, and so forth) may be omitted.

As discussed below, the drift region 12 of the CB MOSFET device 8 illustrated in FIG. 1 includes a number of epitaxial layers 18 having a first conductivity type (e.g., n-type epi layers 18) that form the device layer 14 and the CB layers 16 of the CB MOSFET device 8. Additionally, the epi layers 18 each have a dopant concentration, which may be the same or different, in certain embodiments. While the illustrated embodiment includes three epi layers 18 (e.g., 18A, 18B, and 18C), the CB MOSFET device 8 may include any suitable number of epi layers 18 (e.g., 2, 4, 5, 6, or more) to yield a CB MOSFET device 8 having a particular desired voltage rating. In some embodiments, the epi layers 18 may be formed from one or more wide band gap semiconductor materials, such as silicon carbide, gallium nitride, diamond, aluminum nitride, and/or boron nitride. The epi layers 18 may be fabricated using repeated cycles of epitaxial overgrowth. As illustrated, the first epi layer 18A is disposed above and adjacent to a substrate layer 30, the second epi layer 18B is disposed above and adjacent to the first epi layer 18A, and the third epi layer 18C is disposed above and adjacent to the epi layer 18B.

A top surface 10 of the device layer 14 of the illustrated CB MOSFET device 8 includes a well region 20 having a second conductivity type (e.g., a p-well region 20) and disposed adjacent to a source region 22 having the first conductivity type (e.g., n-type source region 22). A dielectric layer 24 (also referred to as a gate insulating layer or gate dielectric layer) is disposed adjacent to the device layer 14, and a gate electrode 26 is disposed adjacent to the dielectric layer 24. Further, the plurality of CB layers 18 is disposed on a substrate layer 30 (e.g., a semiconductor substrate layer, a wide band gap substrate layer), and a drain contact 32 is disposed on the bottom 11 of the CB MOSFET device 8, adjacent to the substrate layer 30.

Additionally, as illustrated in FIG. 1, a source contact 28 is disposed adjacent to the top surface 10 of the device layer 14, and is disposed on a portion of both the source region 22 and the well region 20 of the device layer 14. For clarity, the portion of the source region 22 (e.g., n-type source region 22) of the CB MOSFET device 8 disposed below the source contact 28 may be more specifically referred to herein as a source contact region 34 of the CB MOSFET device 8. Similarly, a portion of the well region 20 (e.g., p-type well region) of the CB MOSFET device 8 may be more specifically referred to herein as a body region 36 (e.g., p+ body region 36) of the CB MOSFET device 8. Additionally, the portion of the body region 36 that is disposed below and adjacent to (e.g., covered by, directly electrically connected to) the source contact 28, may be more specifically referred to herein as a body contact region 38 (e.g., p+ body contact region 38) of the CB MOSFET device 8.

During on-state operation, an appropriate gate voltage (e.g., at or above a threshold voltage ($V_{TH}$) of the CB MOSFET device 8) may cause an inversion layer to be formed in a channel region 40, as well as a conductive path to be enhanced in a junction field-effect transistor (JFET) region 42 due to accumulation of carriers, allowing current to flow from the drain contact 32 (e.g., drain electrode, drain terminal) to the source contact 28 (e.g., source electrode, source terminal). The channel region 34 may be generally defined as an upper portion of the well region 20 disposed below the gate electrode 26 and the dielectric layer 24.

To reduce on-state resistance (Rds(on)) and resultant on-state conduction losses, the CB MOSFET device 8 includes two CB layers 16A and 16B that each include a plurality of CB regions 46. The plurality of CB regions 46 may include any of the features described in U.S. Pat. No. 9,735,237, entitled, "ACTIVE AREA DESIGNS FOR SILICON CARBIDE SUPER-JUNCTION POWER DEVICES," filed Jun. 26, 2015, the disclosure of which is hereby incorporated by reference in its entirety for all purposes. It may be appreciated that, in other embodiments, the device layer 14 may include other implanted features (e.g., features particular to other device structures/types) without spoiling the effect of the present approach.

The CB regions 46 are oppositely doped relative to the remainder 48 of the CB layers 16A and 16B. In other words, for CB devices 10 having n-type CB layers 16 (e.g., n-type SiC epitaxial layers 18), the CB regions 46 are p-type, and for CB devices 10 having p-type epi layers 18, the CB regions 46 are n-type. Further, the dopant concentration in the CB regions 46 of the CB layer 16A and in the CB regions 46 of the CB layer 16B may be the same or different, in certain embodiments. The CB regions 46 and the remainder 48 of the CB layers 16A and 16B are each generally designed to substantially deplete and to generally provide similar amounts (e.g., substantially equal amounts) of effective charge (e.g., per $cm^2$, normalized to device active area) from ionized dopants under reverse bias. The illustrated charge balance structure allows the CB MOSFET device 8 to achieve high breakdown voltage and low on-state resistance, since the p-type semiconductor portions and the n-type semiconductor portions are both completely depleted under nominal blocking conditions.

Figure 2:
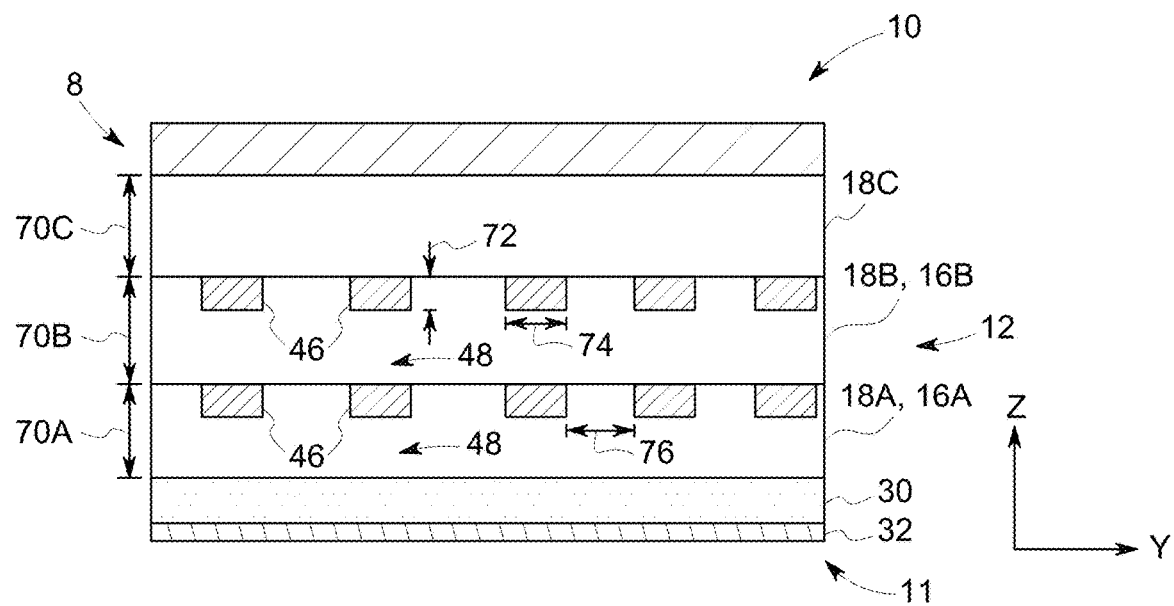
FIG. 2 illustrates a cross-sectional view of the drift region of the CB MOSFET device of FIG. 1, in accordance with an embodiment.

As illustrated, the CB regions 46 of the CB MOSFET device 8 are separated by (e.g., not vertically connected through) and do not extend through the entire thicknesses of the epi layers 18C and 18B. For example, FIG. 2, which is a cross-sectional view of the embodiment of the CB MOSFET device 8 illustrated in FIG. 1, illustrates the dimensions of the epi layers 18A-C and the CB regions 46. In particular, the epi layers 18A, 18B, and 18C have thicknesses 70A, 70B, and 70C, respectively, that may be the same or different, in certain embodiments. Additionally, the CB regions 46 in the CB layers 16A and 16B of the illustrated CB MOSFET device 8 have a particular thickness 72. It should be appreciated that, in some embodiments, the thickness 72 of the CB regions 46 may be different in different CB layers 16. The thickness 72 of the CB regions 46 is less than the thicknesses 70A and 70B of the CB layers 16A and 16B, respectively, and as such, the CB regions 46 are not vertically connected through (i.e., do not extend through the entire thicknesses 70A and 70B) of the epi layers 18A and 18B. It may be appreciated that this feature is in contrast to other CB device designs in which the charge-balance regions are continuous (e.g., continuous vertical pillars that extend through the entire thicknesses of the epi layers 18A and 18B). CB devices including continuous, vertical charge balance pillars are capable of providing low conduction losses and high blocking voltages. However, fabricating continuous, vertical charge balance pillars that extend through the thicknesses 70A and 70B of the epi layers 18A and 18B may be challenging for certain semiconductor materials having low diffusion coefficients of dopants. For example, fabricating such charge balance pillars may be challenging for embodiments in which the epi layers 18A and 18B are fabricated from SiC, which has low diffusion coefficients of dopants compared to silicon (Si).

For example, to manufacture the illustrated CB MOSFET device 8, the first epi layer 18A may be formed on top of the substrate layer 30 using epitaxial growth techniques (e.g., epitaxial SiC grown techniques), and the CB regions 46 may be formed in the first epi layer 18A using ion implantation to yield a first CB layer 16A. Further, the second epi layer 18B may be formed on top of the first epi layer 18A using epitaxial growth techniques, and the CB regions 46 may be formed in the second epi layer 18B using ion implantation to yield a second CB layer 16B. It should be noted that the epitaxial growth/ion implantation steps may be repeated multiple (e.g., 2, 3, 4, 5, or more) times to yield a CB MOSFET device 8 with any suitable number of CB layers 16. Additionally, the final epi layer 18C may be formed on top of the second epi layer 18B using epitaxial growth techniques and may be suitably implanted with particular features to form the device layer 14 of the CB MOSFET device 8.

Additionally, with respect to dimensions, each CB region 46 may have a particular width 74 and a particular spacing 76. In certain embodiments, the dimensions (e.g., thickness 72, width 74, and/or spacing 76) of the CB regions 46 may be different in different CB layers 16. In different embodiments, the CB regions 46 may have different cross-sectional shapes (e.g., defined by implantation energies/doses). For some embodiments, the shape of the CB regions 46 may not substantially vary along the Z-axis.

Further, it should be appreciated that the doping of the epi layers 18, the doping of the CB regions 46, the thicknesses 70 of the epi layers 18, the thickness 72 of the CB regions 46, the width 74 of the CB regions 46, and the spacing 76 between the CB regions 46 may be varied for different embodiments to enable desired electrical performance (e.g., desired blocking voltage) of the CB MOSFET device 8. The disclosed CB MOSFET device 8 may incorporate different values of the doping of the epi layers 18, the doping of the CB regions 46, the thicknesses 70 of the epi layers 18, the thickness 72 of the CB regions 46, the width 74 of the CB regions 46, and the spacing 76 between the CB regions 46 as discussed in co-pending U.S. application Ser. No. 14/752,446, entitled, "ACTIVE AREA DESIGNS FOR SILICON CARBIDE SUPER-JUNCTION POWER DEVICES," filed Jun. 26, 2015, the disclosure of which is hereby incorporated by reference in its entirety for all purposes, to achieve a desired blocking voltage of the CB MOSFET device 8 and a desired reduction in specific on-resistance of the drift region 12.

For example, in some embodiments, certain cell parameters (e.g., the thickness 70 and doping of the epi layers 18) may be selected to provide a blocking voltage of the CB MOSFET device 8 that is between approximately 1 kilovolt (kV) and 10 kV, 1 kV and 5 kV, or any other suitable range. In certain embodiments, the specific on-resistance of the drift region 12 of the CB MOSFET device 8 may between approximately 40% and 50% less than the specific on-resistance of a drift region of a non-SJ/CB device (e.g., a semiconductor power device without the CB regions 46). Further, in some embodiments, the dopant concentration of the CB regions 46 and/or the epi layers 18 may be between approximately $5 \times 10^{15}$ cm$^{-3}$ and approximately $5 \times 10^{18}$ cm$^{-3}$, approximately $2 \times 10^{16}$ cm$^{-3}$ and approximately $1 \times 10^{18}$ cm$^{-3}$, or approximately $5 \times 10^{16}$ cm$^{-3}$ and approximately $5 \times 10^{17}$ cm$^{-3}$. Further, in some embodiments, the effective sheet dopant concentration of the CB regions 46, which may be calculated by normalizing the doping concentration of the CB regions 46 to the unit cell area of the CB MOSFET device 8, may be less than or equal to approximately $1.1 \times 10^{13}$ cm$^{-2}$. Additionally, in some embodiments, the spacing 76 between the CB regions 46 may be between approximately 0.25 micrometers (μm) and approximately 10 μm, approximately 0.5 μm and approximately 8 μm, approximately 0.75 μm and approximately 6 μm, or approximately 1 μm and approximately 3 μm.

As noted above, the CB MOSFET device 8 may also include features to decrease switching losses and increase switching speed. For example, the embodiment of the CB device 80 (e.g., a CB MOSFET device) illustrated in FIG. 3 includes a connection region 100 having the same conductivity type as the CB regions 46 (opposite conductivity type as the epi layers 18) that is implanted into each of the epi layers 18. The connection region may include two or more intentionally misaligned and overlapping implantation regions, forming a narrow and deep connection region 100 (e.g., a bus/connection) connecting various CB regions 46. In certain embodiments, the CB device 80 may include any suitable number of connection regions 100 in the form of continuous, vertical pillars or continuous, vertical blocks) that are implanted into portions of the epi layers 18A-C. In particular, the disclosed connection regions 100 are disposed adjacent to one or more highly doped regions 102 (e.g., top regions, second conductivity regions, well regions 20, body regions 36, body contact regions 38, or junction barrier regions) of the same conductivity type as the connection region 100 and the CB regions 46. The one or more highly doped regions 102 may be disposed adjacent to (e.g., disposed on, disposed in, implanted in, etc.) the top surface 10 of the device layer 14 of the CB device 80 (e.g., a well region 20, a body region 36, a body contact region 38, a junction barrier region). Additionally, the disclosed connection regions 100 may connect at least one highly doped region 102 disposed in the device layer 14 to at least one of the plurality of CB regions 46 of the CB layers 16. In particular, the disclosed connection regions 100 may extend vertically from one or more highly doped regions 102 (e.g., from one or more features near the top surface 10 of the device layer 14) to at least one CB region 46 of the CB layers 16. For example, the connection regions 100 may adjoin the highly doped regions 102 and at least one CB region 46. In some embodiments, the connection regions 100 may overlap with the highly doped regions 102 and at least one CB region 46.

In some embodiments, the one or more connection regions 100 may have a depth 104 (e.g., vertical dimension, thickness) to reach the deepest CB regions 46 (i.e., the CB regions 46 that are nearest the substrate 30 and farthest from the device layer 14). Further, the depth 104 of the one or more connection regions 100 may be such that the connection regions 100 extend to and contact (e.g., are disposed adjacent to) the deepest CB regions 46, extend through (e.g., overlap with) a portion of the thicknesses 72 of the deepest CB regions 46, or extend through (e.g., overlap with) the entire thicknesses 72 of the deepest CB regions 46. For example, the depth 104 may be greater than or equal to the sum of the thicknesses 70 of n-1 epi layers 18, where n is the total number of epi layers 18 in a CB device 80.

Figure 3:
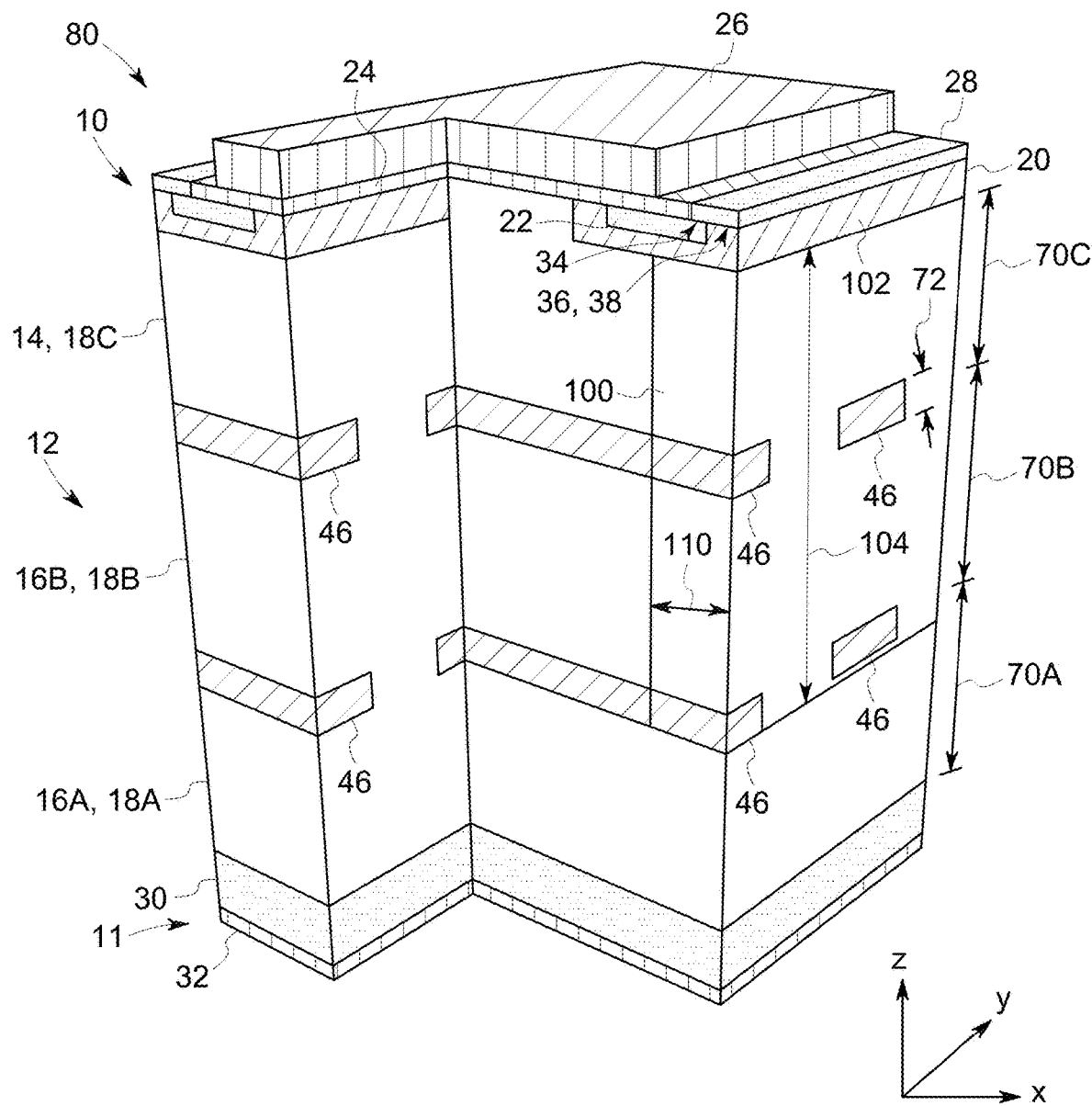
FIG. 3 illustrates a perspective view of a CB MOSFET device that includes a connection region that adjoins the CB regions of the CB layers to a well region of the CB device, in accordance with an embodiment.

For example, in the embodiment illustrated in FIG. 3, the depth 104 of the connection region 100 is greater than the sum of the thicknesses 70B and 70C of the CB layers 16A and 16B (i.e., the lower two epi layers 18A and 18B). In particular, in the illustrated embodiment, the connection region 100 extends from (e.g., is disposed adjacent to and contacts) the highly doped region 102, which in this case is the well region 20. The connection region 100 extends through the third epi layer 18C (i.e., through the thickness 70C of the third epi layer 18C), through the second epi layer 18B (i.e., through the thickness 70B of the second epi layer 18B and the thickness 72 of the CB regions 46 in the second CB layer 16B), and through a portion of the thickness 70C of the first epi layer 18A (i.e., through the thickness 72 of the CB regions 46 in the first CB layer 16A). However, it should be appreciated that in other embodiments, the depth 104 may be such that the connection region 100 only extends through the thicknesses 70B and 70C of the second and third epi layers 18B and 18C, respectively (i.e., the connection region 100 does not extend through the CB regions 46 in the bottom CB layer 16A), or such that the connection region 100 extends through only a portion of thickness 72 of the CB regions 46 in the bottom CB layer 16A.

The one or more connection regions 100 may be fabricated by introducing dopants (e.g., boron, aluminum, nitrogen, phosphorus) into the epi layers 18 of the CB device 80 using high energy ion implantation. A single connection region may include multiple misaligned and/or overlapping implantation regions. In some embodiments, dopants may be implanted with implant acceleration energies between approximately 500 keV and approximately 60 MeV to achieve the desired depth 104. Additionally, in certain embodiments, the one or more connection regions 100 may formed using high energy ion implantation along with high stopping power or high blocking mask (e.g., silicon on insulator (SOI), polysilicon, thick silicon oxide, high-Z metals such as platinum, molybdenum, gold). In particular, the high stopping power mask may be placed on the top surface 10 of the top epi layer 18C after epitaxial growth, and the high stopping power mask may have openings for one or more connection regions 100 while covering the remainder of the top surface 10 of the top epi layer 18C. If a single connection region 100 includes multiple implantation regions, this process may be repeated multiple times for each implantation. In such an embodiment, the blocking mask may be removed and a new blocking mask applied in a slightly different location. In some embodiments, the new blocking mask may be added on top of the existing blocking mask without removing the existing blocking mask. In some embodiments, the blocking mask may be shifted slightly to the new implantation location. Additionally, the one or more connection regions 100 may be formed before or after the highly doped regions 102 (e.g., the well region 20) in different embodiments. In some embodiments, the one or more connection regions 100 may be at least partially implanted between the epi growth steps (e.g., implanted before or after the CB regions 46 are formed in the epi layer 18B and before the epi growth of the next epi layer 18C) such that a lower energy implant may be used to achieve a suitable depth 104. The resulting connection region may have a narrower width than the minimum aperture feature size of the blocking mask.

The one or more connection regions 100, which connect the CB regions 46 to the one or more highly doped regions 102, in this case the well region 20, generally decrease switching losses and increase maximum switching speed of the CB device 80. In particular, carriers from the well region 20 may flow directly to the CB regions 46 via the one or more connection regions 100 during transition of the CB device 80 from off-state (e.g., blocking state) to on-state (e.g., conducting state), and similarly, carriers from the CB regions 46 may flow directly to the well region 20 via the one or more connection regions 100 during transition of the CB device 80 from on-state to off-state. Further, in contrast to other techniques for increasing recombination-generation rates of the carriers, such as introducing point defects/recombination centers into the epi layers 18 using in-situ doping, neutron irradiation, and so forth, the one or more connection regions 100 may decrease switching losses and increase switching speeds of the CB device 80 without substantially increasing the leakage current of the CB device 80.

In some embodiments, the switching speed of the CB device 80 having the one or more connection regions 100 may be between approximately 10 and approximately 2000, approximately 25 and approximately 1000, approximately 50 and approximately 750, approximately 75 and approximately 500, or approximately 100 and approximately 250 times greater than the switching speed of CB devices without the one or more connection regions 100. In certain embodiments, the switching speed of the CB device 80 including the one or more connection regions 100 may be at least 1 kilohertz (kHz). In some embodiments, the switching speed of the CB MOSFET device 8 may be between approximately 75 kHz and approximately 150 kHz, approximately 85 kHz and approximately 125 kHz, or approximately 95 kHz and approximately 105 kHz. CB devices utilizing floating CB regions without the disclosed connection regions 100 may have switching speeds less than approximately 1 kHz, less than approximately 750 Hz, less than approximately 500 Hz, or less than approximately 250 Hz. Accordingly, the disclosed CB device 80 having the one or more connection regions 100 may have significantly faster switching speeds than CB devices utilizing floating CB regions without the disclosed connection regions 100.

As noted above, the one or more highly doped regions 102 (e.g., the top regions) may be disposed adjacent to the top surface 10 of the device layer 14. In some embodiments, the one or more highly doped regions 102 may be or may include the well region 20 (e.g., the p-type well region 20). In certain embodiments, the one or more highly doped regions 102 may be or may include the body region 36 (e.g., the p+ body region 36) the body contact region 38 (e.g., the p+ body contact region 38), and/or a junction barrier region (e.g., a junction barrier region of a junction barrier Schottky (JBS) or a merged PiN Schottky (MPS) diode). That is, the one or more connection regions 100 may be disposed adjacent to and/or may extend through (e.g., overlap with) at least a portion of the well region 20, the body region 36, and/or the body contact region 38. In some embodiments, the one or more highly doped regions 102 may have a dopant concentration between approximately $2 \times 10^{16}$ cm$^{-3}$ and approximately $5 \times 10^{20}$ cm$^{-3}$, approximately $5 \times 10^{16}$ cm$^{-3}$ and approximately $1 \times 10^{19}$ cm$^{-3}$, or approximately $1 \times 10^{17}$ cm$^{-3}$ and approximately $5 \times 10^{18}$ cm$^{-3}$. In some embodiments, the highly doped regions 102 may generally have a doping concentration that is at least 50% greater (e.g., between approximately 50% and 200%, or more) than the doping concentration in the CB regions 46 and/or the connection regions 100. In certain embodiments, the highly doped regions 102 may generally have a doping concentration that is at least $1 \times 10^{13}$ cm$^{-2}$/thickness of the region (e.g., the CB regions 46 and/or the connection regions 100). In some embodiments, the highly doped regions 102 may generally have a doping concentration that is between approximately 1 order of magnitude and 6 orders of magnitude greater than the doping concentration in the CB regions 46 and/or the connection regions 100.

As illustrated, the connection region 100 also includes a width 110. In general, connection regions 100 that are narrower (i.e., smaller width 110) help enable the device 80 to achieve higher switching speeds with no significant impact on device blocking voltage. However, manufacturing constraints may limit dimensions of implantation regions such that implantation regions having a width 110 less than a minimum viable width is not achievable However, by forming the connection region 100 with two intentionally misaligned and overlapping implantation regions, the width of the overlap forms a connection region that may have a width smaller than the minimum width of a single implantation region or blocking mask feature used to pattern such implant, enabling a narrower connection region. The width 110 and the dopant concentration of the connection region 100 may be selected to maintain charge balance within the CB layers 16 (e.g., the lower epi layers 18A and 18B) having the CB regions 46, as well as to enable desirable electrical performance of the CB device 80 (e.g., a desired blocking voltage). For example, in some embodiments, the width 110 may be between approximately 1 μm and approximately 10 μm. As is discussed in more detail below with regard to FIGS. 9-11, each implantation region may be between approximately 2 μm wide and approximately 7 μm wide. The overlap between the implantation regions may be between approximately 0.5 μm and between approximately 4 μm. Further, the dopant concentration of the connection region 100 may be between approximately $1 \times 10^{16}$ cm$^{-3}$ and approximately $1 \times 10^{17}$ cm$^{-3}$, approximately $1 \times 10^{16}$ cm$^{-3}$ and approximately $4 \times 10^{16}$ cm$^{-3}$, or approximately $4 \times 10^{16}$ cm$^{-3}$ and approximately $1 \times 10^{17}$ cm$^{-3}$. In some embodiments, the dopant concentration of the connection region 100 may be equal to or less than the dopant concentration of the CB regions 46. The dopant concentration of the connection region (e.g., the overlap between implantation regions) may range from approximately 0.5 times the dopant concentration of the CB layers 18 to approximately 1.2 times the dopant concentration of the CB layers 18.

In some embodiments, the CB regions 46 may entirely or partially overlap with the connection region 100. For example, as illustrated, the CB regions 46 may entirely overlap with the connection region 100 such that the CB regions 46 extend through the width 110 of the connection region 100. In some embodiments, as illustrated by the embodiment of the CB device 120 in FIG. 4, the CB regions 46 may only extend partially through the width 110 of the connection region 100. For example, the CB regions 46 may overlap with the connection region 100 by a distance 140 that is less than the width 110 of the connection region 100. In some embodiments, the distance 140 may be greater than or equal to 0.1 μm. In certain embodiments, the distance 140 may be less than half of the width 110.

Figure 4:
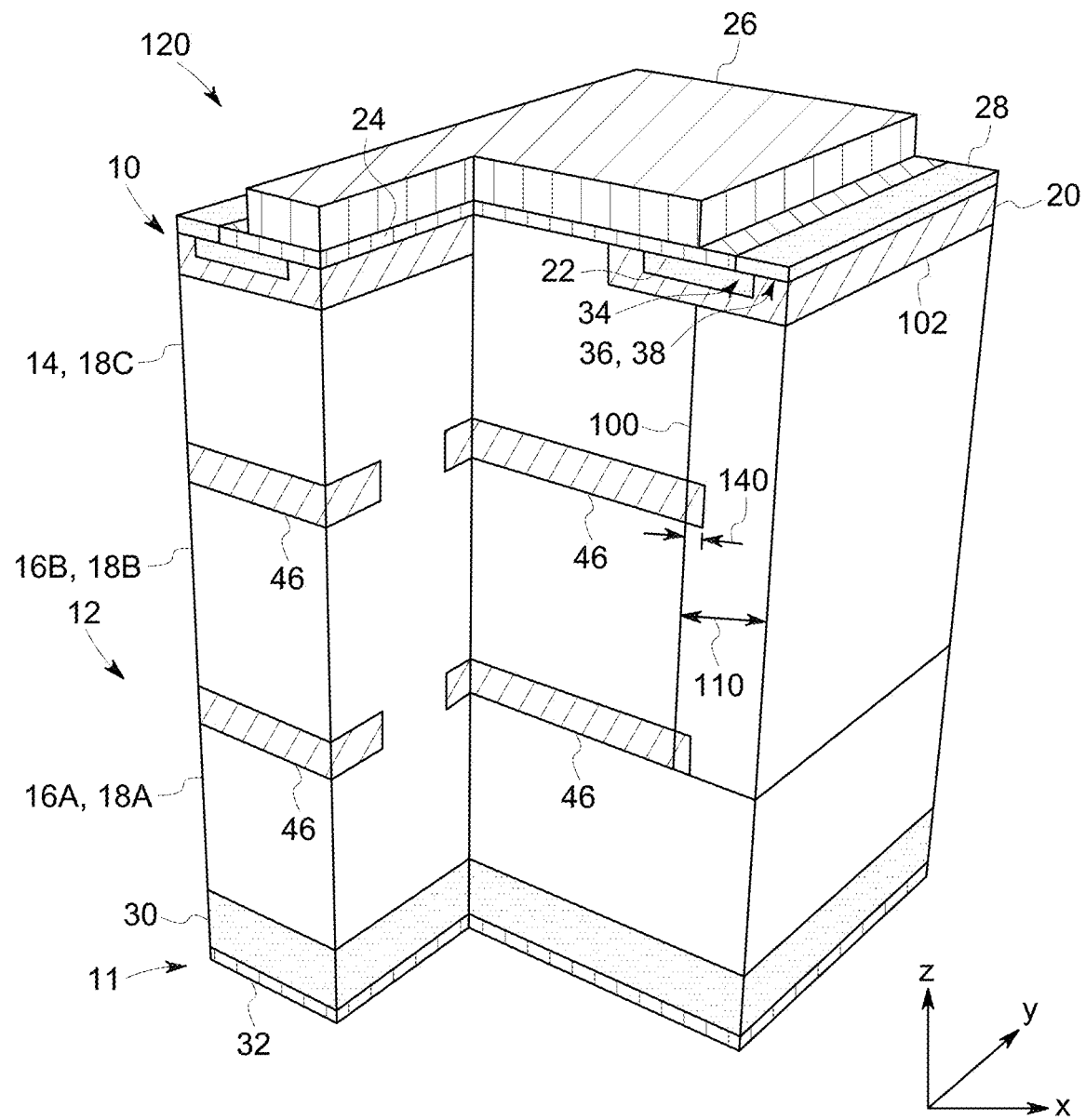
FIG. 4 illustrates a perspective view of a CB MOSFET device that includes a connection region that adjoins the CB regions of the CB layers to a well region of the CB device, in accordance with an embodiment.

Although the embodiments of the CB devices 80 and 120 illustrated in FIGS. 3 and 4, respectively, include one connection region 100, it should be noted that the CB devices 80 and 120 may include any suitable number of connection regions 100.

Figure 5:
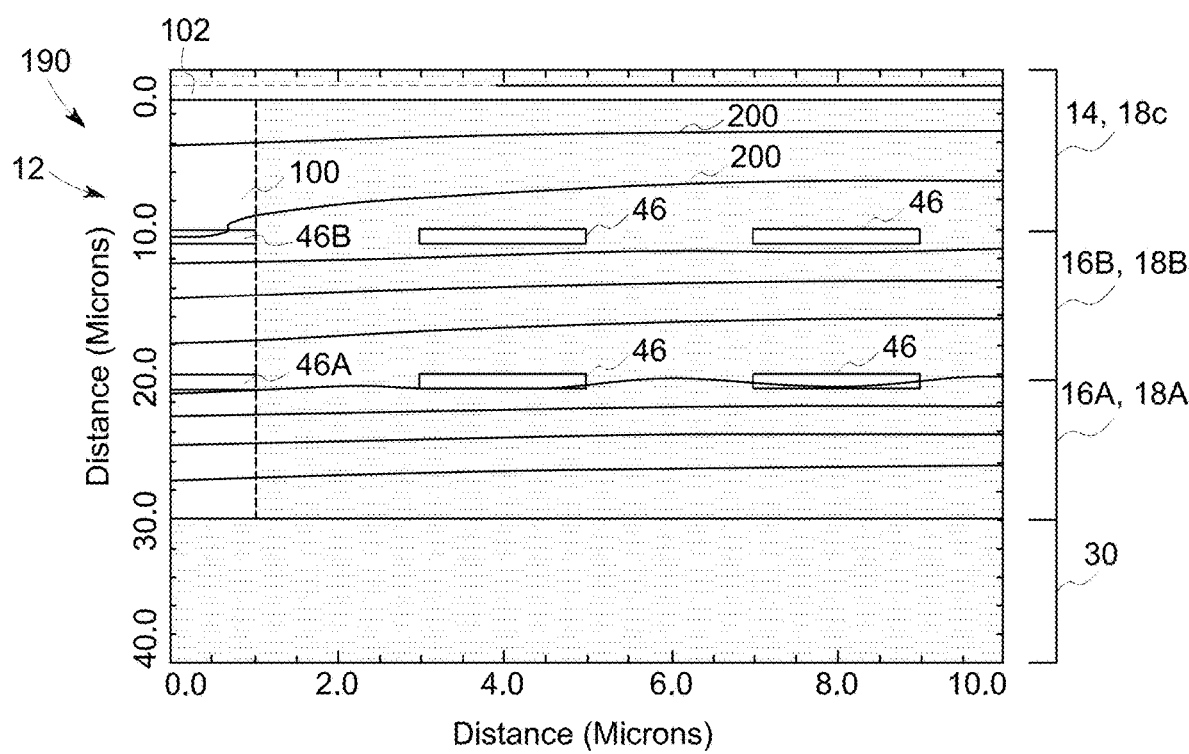
FIG. 5 is a cross-sectional view of a drift region of a CB device including a connection region that adjoins the CB regions of the CB layers to a top region of the CB device, wherein the equipotential lines demonstrate the electric field present under reverse bias conditions, in accordance with an embodiment.

FIG. 5 illustrates a cross-sectional view of the drift region 12 of an embodiment of a CB device 190 that includes the CB regions 46 and the connection region 100. In particular, in the illustrated embodiment, the multi-layer drift region 12 includes the three epi layers 18A, 18B, and 18C, and the CB regions 46 are formed in the lower epi layers 18A and 18B (i.e., CB layers 16A and 16B). Further, in the illustrated embodiment, the connection region 100 connects two particular CB regions, 46A and 46B, with the highly doped region 102. Additionally, FIG. 5 includes equal potential lines 200 that indicate the electric field present in the drift region 12 of the CB device 190 under reverse bias conditions. The strength of the electric field is represented as being stronger when the lines are close to one another and weaker when there is larger spacing between the equal potential lines 200. As seen in FIG. 5, for the illustrated embodiment, the spacing between the equal potential lines 200 does not substantially change with increasing distance from the connection region 100. As such, the connection region 100 does not substantially change or alter the strength of the electric field in the drift region 12. Thus, the connection region 100 may increase the switching speed of the CB device 190 by providing carriers from the highly doped region 102 to the CB regions 46 without substantially changing the electric field distribution and without resultantly decreasing the blocking voltage of the CB device 190.

Figure 6:
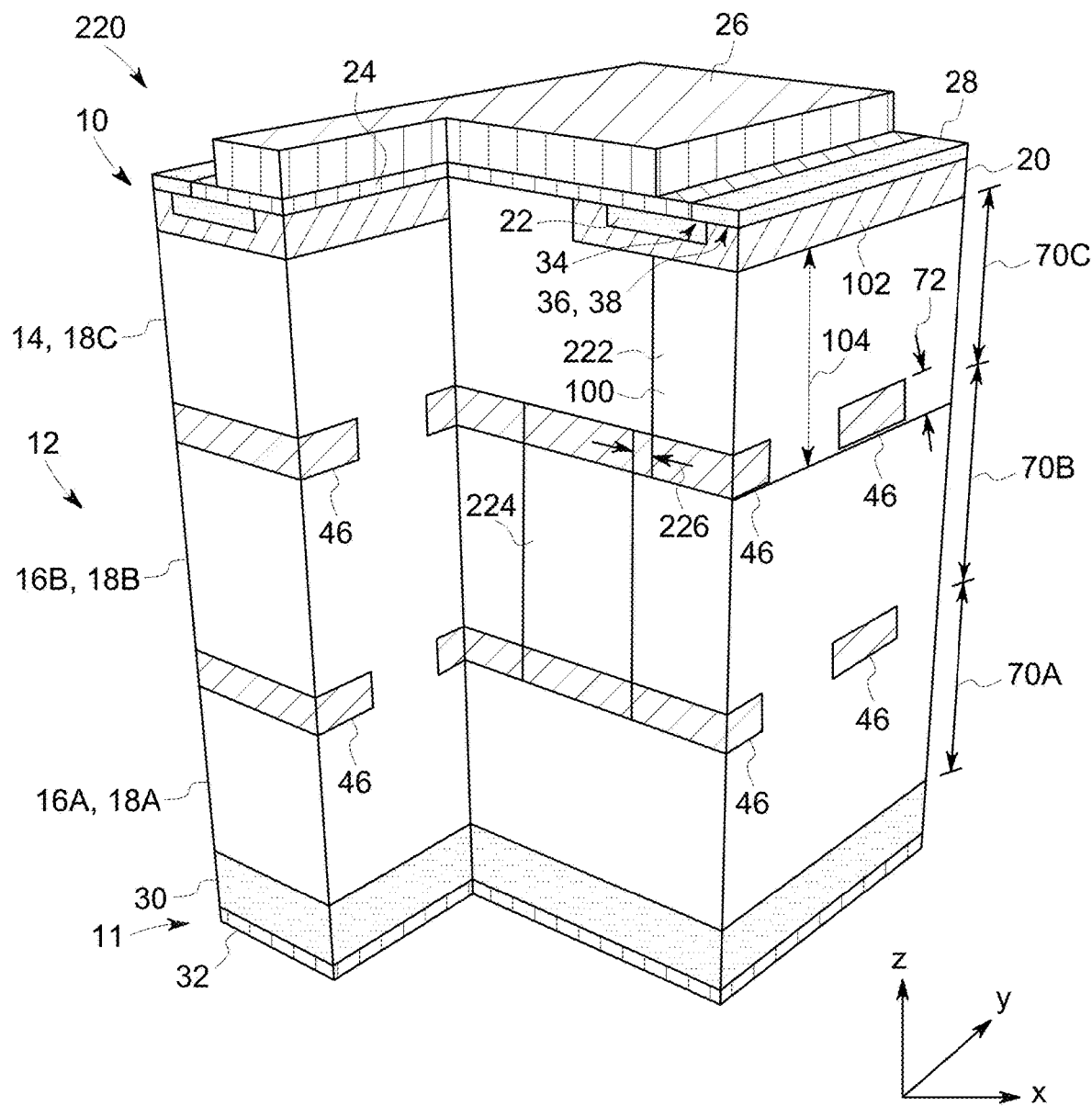
FIG. 6 is a perspective view of a CB device that includes a segmented connection region that adjoins the CB regions of the CB layers to a top region of the CB device, in accordance with an embodiment.
Figure 7:
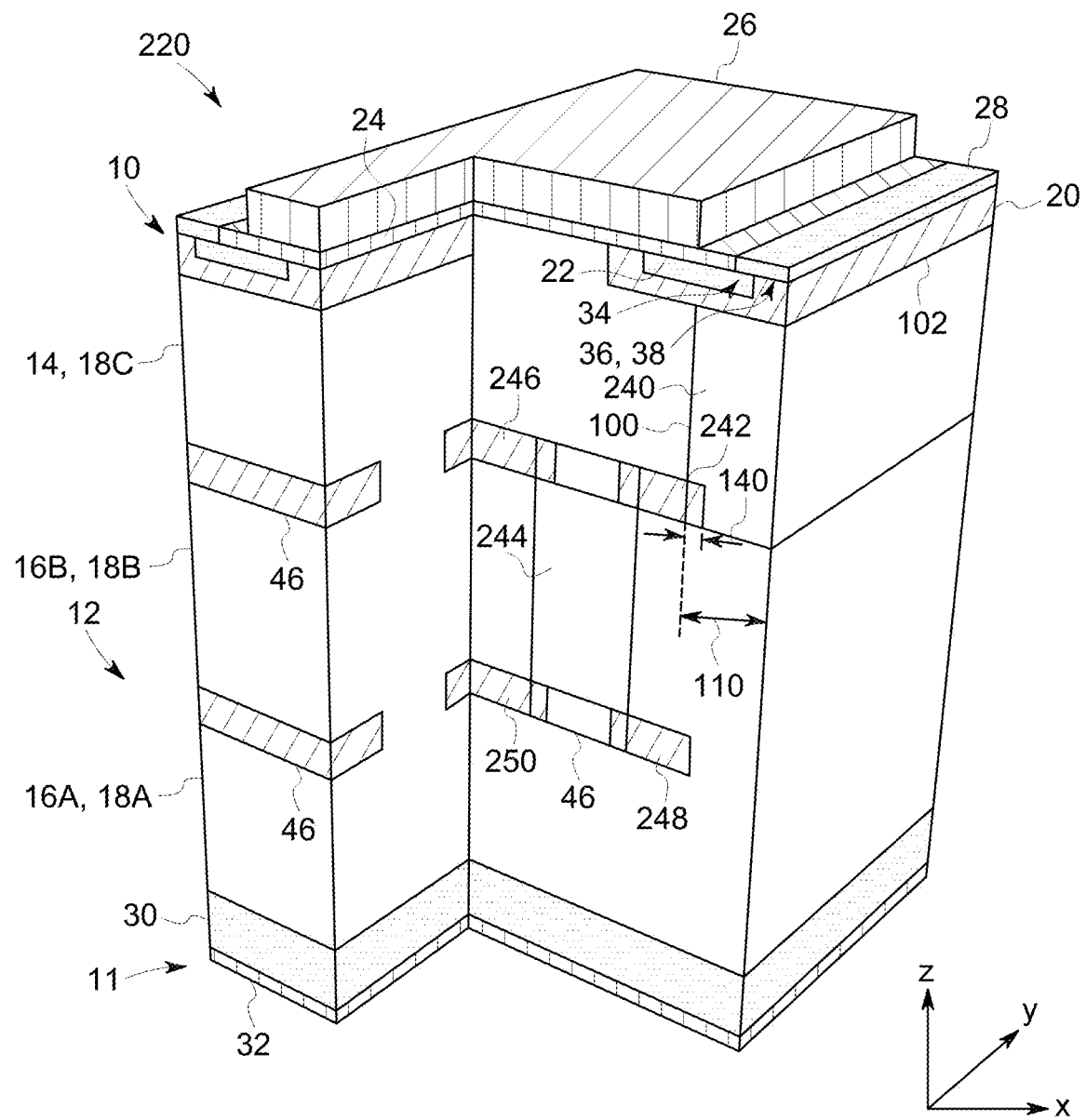
FIG. 7 is a perspective view of a CB device that includes a segmented connection region that adjoins the CB regions of the CB layers to a top region of the CB device, in accordance with an embodiment.

FIG. 6 illustrates an embodiment of a CB device 220 including a segmented connection region 100. As illustrated, the connection region 100 may include a first connection segment 222 that extends from the highly doped region 102 to a CB region 46 in the second CB layer 16B. Additionally, the connection region 100 may include a second connection segment 224 that extends from the CB region 46 in the second CB layer 16B to a CB region 46 in the first CB layer 16A. As illustrated, the first connection segment 222 and the second connection segment 224 are not adjoined (e.g., are staggered, are not vertically aligned). In particular, the second connection segment 224 is spaced apart from the first connection segment 222 by a distance 226. It should be noted that the connection region 100 may include any suitable number of connection segments, such as two, three, four, five, or more, and the connection segments may be adjoined or not adjoined in different CB layers 16. Further, in some embodiments, the connection region 100 may include connection segments that extend through multiple CB regions 46 in the same CB layer 16. For example, as illustrated in FIG. 7, the connection region 100 may include a first connection segment 240 that extends from the highly doped region 102 to a first CB region 242 in the second CB layer 16B. Additionally, the connection region 100 may include a second connection segment 244 that extends from the first CB region 242 in the second CB layer 16B and from a second CB region 246 in the second CB layer 16B to third and fourth CB regions 248 and 250, respectively, in the first CB layer 16A. Further, as illustrated, the first connection segment 240 and the second connection segment 244 may not be adjoined in some embodiments. In certain embodiments, the first connection segment 240 and the second connection segment 244 may be adjoined (e.g., may at least partially overlap with one another).

Figure 8:
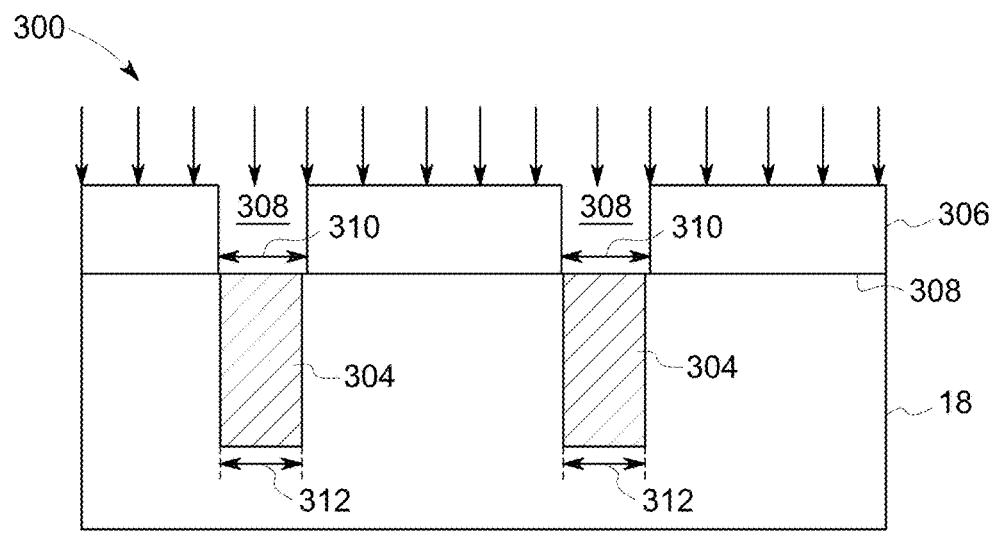
FIG. 8 is a side, section view of an embodiment of an epi layer for use in an CB device having first implantation regions of a second conductivity type, in accordance with an embodiment.
Figure 9:
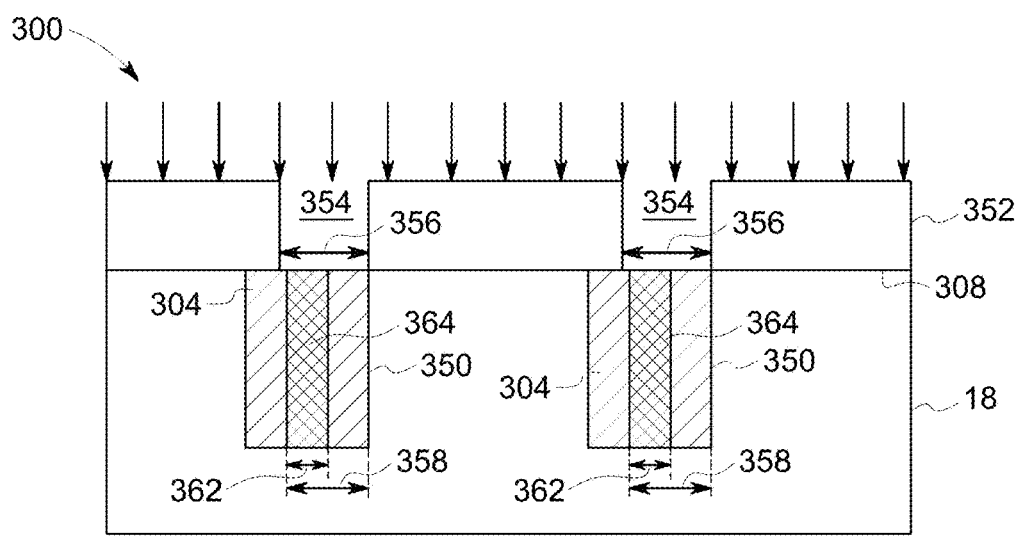
FIG. 9 is a side, section view of the epi layer of FIG. 8 having second implantation regions that overlap with the first implantation regions, in accordance with an embodiment.
Figure 10:
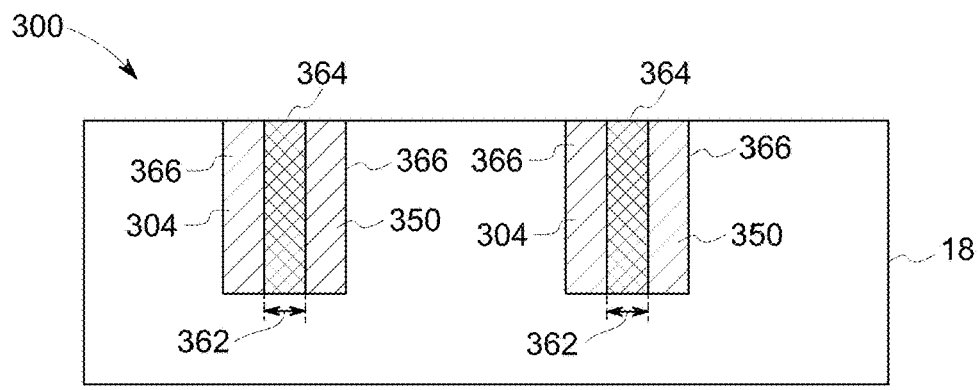
FIG. 10 is a side, section view of the CB device of FIG. 9 having connection regions with overlapping first and second implantation regions, in accordance with an embodiment.

As previously discussed, connection segments 240, 244 having a higher aspect ratio (e.g., narrower) help enable the device 220 to achieve higher switching speeds. However, manufacturing constraints (e.g., masking technology) may make implantation regions narrower than a minimum width impractical. To achieve connection segments 240, 244 that are effectively narrower than the process limited width, the connection segments 240, 244 may include two misaligned, overlapping implantation regions. The overlap between the two implantation regions forms a connection region that may be narrower than the minimum implantation region width. The highly doped connection region may be flanked on either side by low doped regions where the implantation regions do not overlap. FIGS. 8-10 illustrate how connection regions or segments may be formed from multiple misaligned overlapping implantation regions.

FIG. 8 is a side, section view of an embodiment of an CB device 300 in which an epi layer includes first implantation regions 304 of a second conductivity type. As shown, a first blocking mask 306 is applied to a top surface 308 of the epi layer 18. The first blocking mask 306 includes apertures 308 of width 310. An ion implantation process is used to dope the portion of the epi layer 18, forming the region 304. Specifically, ions are accelerated toward the epi layer 18. The ions do not penetrate into the portions of the epi layer 18 beneath the blocking mask 306, but where there are apertures 308, the ions travel through the aperture in the blocking mask 306 and are implanted into the epi layer 18. When the ions are implanted into the epi layer 18, the local area of the epi layer 18 is doped, forming the first implantation regions 304. The first implantation regions 304 have a width 312, which may be approximately equal to the width 310 of the apertures 308 in the first blocking mask 306. In some embodiments, the first implantation region 304 may have a width 312 between approximately 2 μm wide and approximately 7 μm wide. For example, the width 312 of the first implanted region 304 may be approximately 2.0 μm, 2.5 μm, 3.0 μm, 3.5 μm, 4.0 μm, 4.5 μm, 5.0 μm, 5.5 μm, 6.0 μm, 6.5 μm, or 7.0 μm. The first blocking mask 306 is then removed.

FIG. 9 is a side, section view of the CB device 300 of FIG. 8 having a second implantation region 350 that overlaps with the first implantation region 304. As shown, once the first blocking mask is removed, a second blocking mask 352 is applied to the top surface 308 of the epi layer 18. The second blocking mask 352 has apertures 354 having a width 356. The width 356 of the apertures 354 of the second blocking mask 352 may be the same or different from the width of the apertures of the first blocking mask. The apertures 354 of the second blocking mask 352 may be misaligned with, but overlapping with the apertures of the first blocking mask. An ion implantation process is used to dope the epi layer 18, forming second region 350, having a width 358. In some embodiments, the second implanted region 350 may have a width 358 between approximately 2 μm wide and approximately 7 μm wide. For example, the width 312 of the first implantation region 304 may be approximately 2.0 μm, 2.5 μm, 3.0 μm, 3.5 μm, 4.0 μm, 4.5 μm, 5.0 μm, 5.5 μm, 6.0 μm, 6.5 μm, or 7.0 μm. Further, the first and second implantation regions 304, 350 overlap one another by a width 362, forming a connection region 364.

The width 362 may range from approximately 0.5 μm to approximately 4 μm. For example, the width 362 may be approximately 0.5 μm, 1.0 μm, 1.5 μm, 2.0 μm, 2.5 μm, 3.0 μm, 3.5 μm, or 4.0 μm. Because the width 362 of the connection region 364 may be less than the minimum aperture width 310, 356 of the first and second blocking masks, the connection region 364 may have a narrower width 362 than a connection region made with a single implantation, enabling the CB device 300 to reach faster switching speeds. Once the second implantation region 350 has been formed, the second blocking mask 352 may be removed.

FIG. 10 is a side, section view of the CB device 300 of FIG. 9 having overlapping first and second implantation regions 304, 350 forming the connection regions 364. As shown, the connection region 364 has the width 362 and extends through the internal portion of the doped region. The connection region 364 is of a second conductivity type. On either side of the connection region 364 are low doped regions 366. The dopant concentration of the connection region 364 may range from approximately 0.5 times the dopant concentration of the CB layer to approximately 1.4 times the dopant concentration of the CB regions. For example, the connection region 364 may have a dopant concentration between approximately $0.5 \times 10^{16}$ cm$^{-3}$ and $5 \times 10^{16}$ cm$^{-3}$. Thus, by creating a connection region 364 with a width 362 smaller than the minimum implantation region width, the connection region is narrower than would otherwise be possible, resulting in a CB device 300 with higher switching speeds.

The dopant concentrations of epi region 18 is referred to as N1 (first type of conductivity). The concentration of the second type of conductivity dopants in the connection region 364 is referred to as N2. Whether the low doped regions 366 are of a first or second conductivity type depends on the ratio of N1 and N2. Specifically, if N2/2 is greater than N1, the low doped regions 366 are of the second conductivity type. However, if N2/2 is less than N1, the low doped regions 366 are of the first conductivity type. This assumes that both misaligned implants have identical doping profiles/concentrations.

Figure 11:
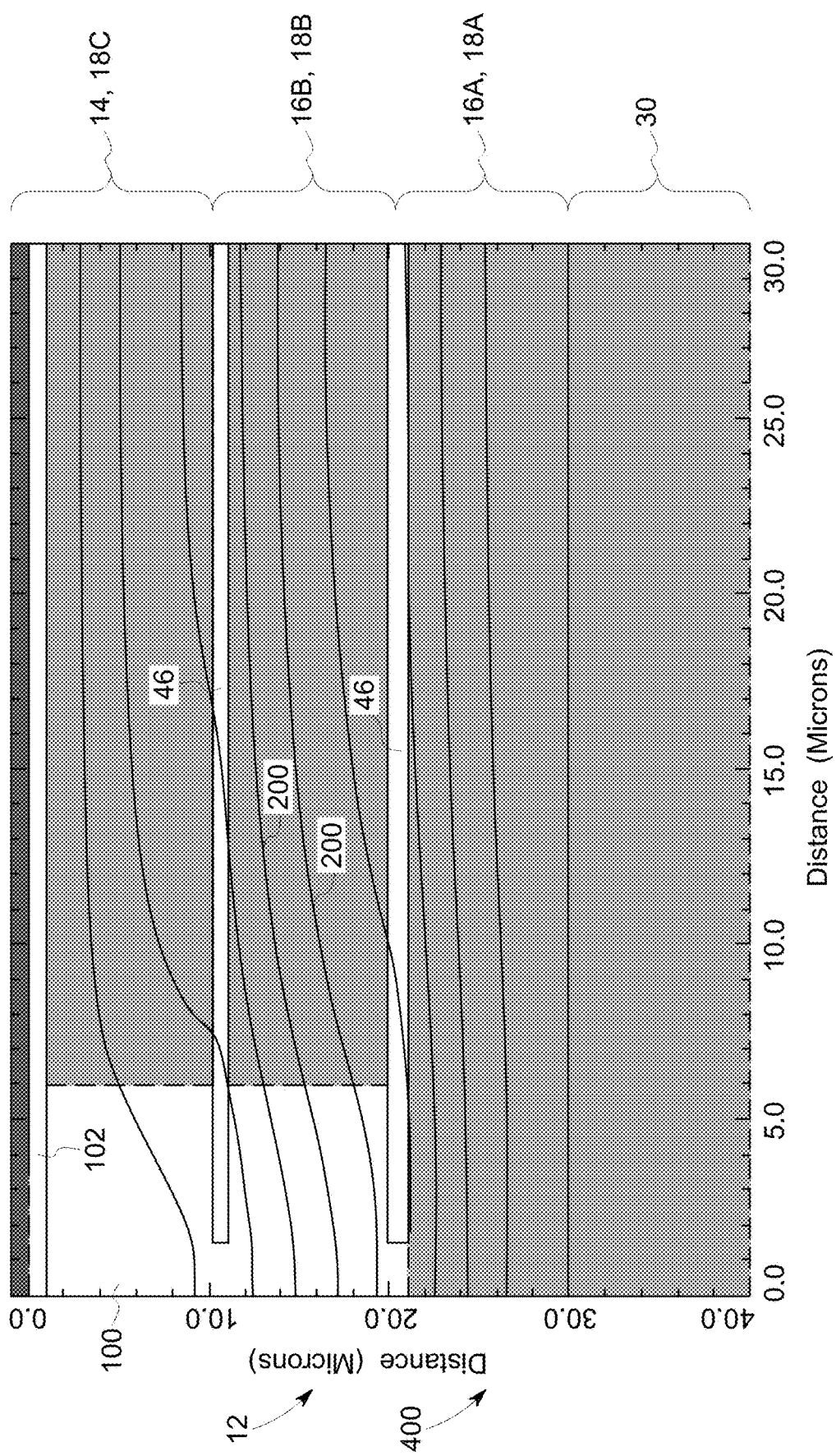
FIG. 11 is a cross-sectional view of a drift region of an embodiment of a CB device wherein first and second low doped regions of the connection region are of the second conductivity type, and N2/2>N1, in accordance with an embodiment.

FIG. 11 is a cross-sectional view of the drift region 12 of an embodiment of a CB device 400 wherein the low doped regions are of the second conductivity type. In the instant embodiment, N2/2 is greater than N1. The multi-layer drift region 12 includes the three epi layers 18A, 18B, and 18C. The CB regions 46 are formed in the lower epi layers 18A and 18B (i.e., CB layers 16A and 16B). Further, in the illustrated embodiment, the connection region 100 connects two particular CB regions 46 with the highly doped region 102. The equal potential lines 200 indicate the electric field present in the drift region 12 of the CB device 400 under reverse bias conditions. The strength of the electric field is stronger when the lines are close to one another and weaker when the equal potential lines 200 are spaced apart from one another. In the illustrated embodiment, the spacing between the equal potential lines 200 does not substantially change with addition of connection region 100. As such, the connection region 100 does not substantially change or alter the strength of the electric field in the drift region 12. Thus, the connection region 100 and adjacent low doped regions of the second conductivity type may increase the switching speed of the CB device 400 by providing carriers from the highly doped region 102 to the CB regions 46 without substantially changing the electric field distribution and without resultantly decreasing the blocking voltage of the CB device 400.

Figure 12:
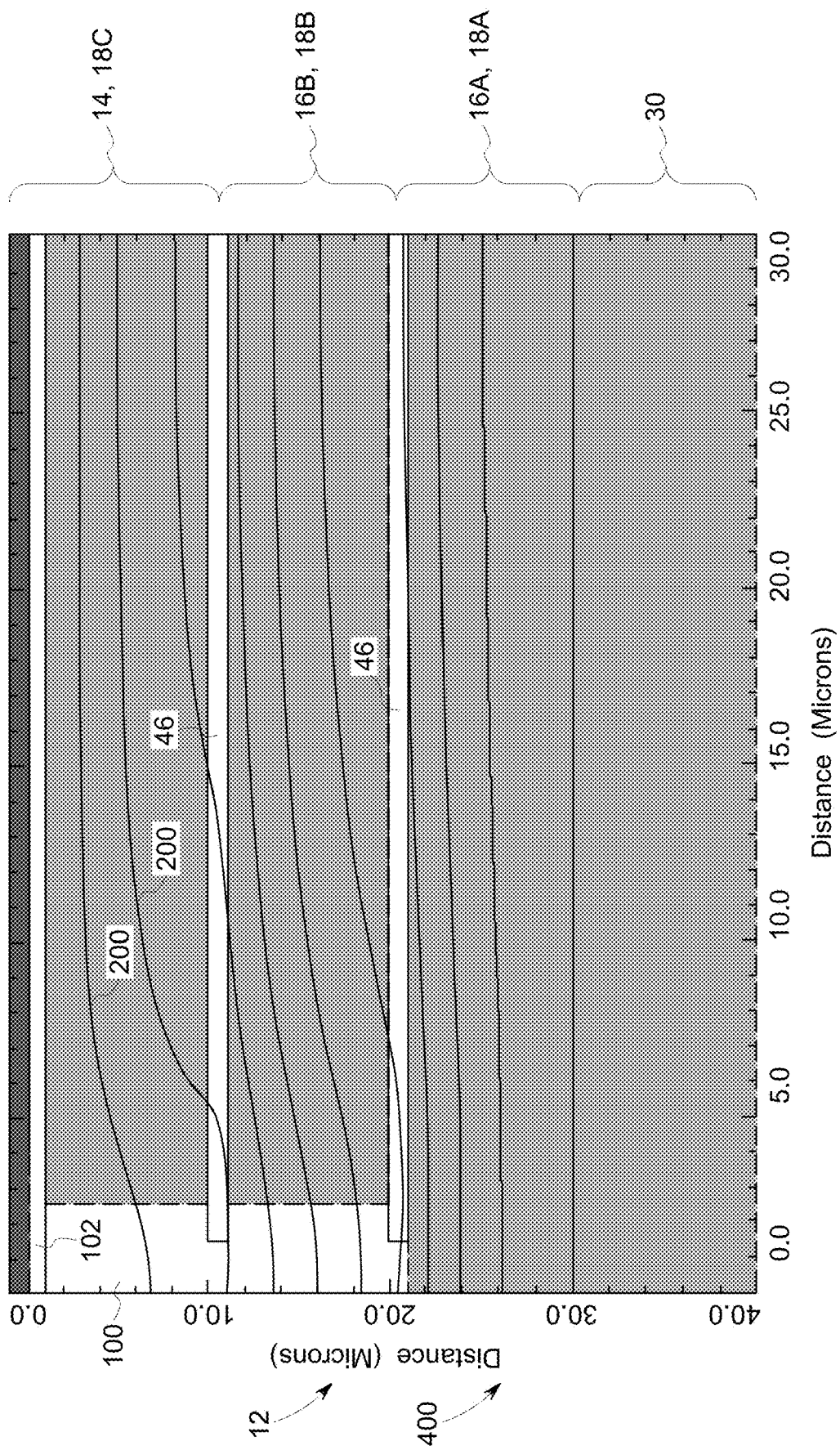
FIG. 12 is a cross-sectional view of the drift region of an embodiment of a CB device wherein the first and second low doped regions of the connection region are of the second conductivity type, and N2/2<N1, in accordance with an embodiment.

FIG. 12 is a cross-sectional view of the drift region 12 of an embodiment of the CB device 400 wherein the low doped regions of the connection region 100 are of the first conductivity type. In this embodiment, N2/2 is less than N1. The equal potential lines 200 are relatively unchanged as compared to the embodiment in which N2/2 is greater than N1 and the low doped regions are of the second conductivity type, shown in FIG. 11. As with the equal potential lines 200 of FIG. 11, the spacing between the equal potential lines 200 does not substantially change with addition of the connection region 100. As such, the connection region 100 does not substantially change or alter the strength of the electric field in the drift region 12. Thus, the connection region 100 and adjacent low doped regions of the first conductivity type may increase the switching speed of the CB device 400 by providing carriers from the highly doped region 102 to the CB regions 46 without substantially changing the electric field distribution and without resultantly decreasing the blocking voltage of the CB device 400.

Figure 13:
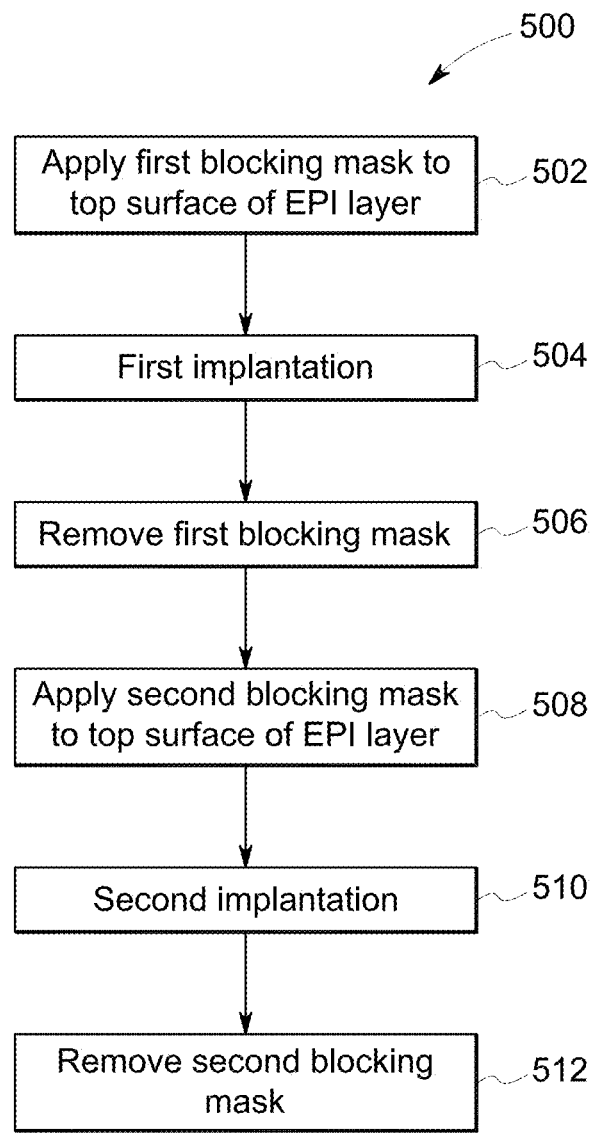
FIG. 13 is a flow chart of a process for creating one or more connection regions in the CB device that are formed by multiple misaligned and overlapping implantation regions, with connection region flanked on either side by the first and second low doped regions, in accordance with an embodiment.

FIG. 13 is a flow chart of a process 500 for creating one or more connection regions in a CB device that include multiple intentionally misaligned and overlapping implantation regions, forming a narrow connection region flanked on either side by low doped regions. In block 502, a first blocking mask is applied to the top surface of the epi layer. The blocking mask includes first apertures that correspond to the width and locations of the desired first implantation regions. The first apertures may be between approximately 2 μm wide and approximately 7 μm wide. For example, the first apertures may be approximately 2.0 μm, 2.5 μm, 3.0 μm, 3.5 μm, 4.0 μm, 4.5 μm, 5.0 μm, 5.5 μm, 6.0 μm, 6.5 μm, or 7.0 μm wide.

In block 504, a first ion implantation process is used to dope a portion of the epi layer, forming the first implantation regions of a second conductivity type. Specifically, ions are accelerated toward the first blocking mask. The blocking mask blocks many of the ions, but where there are first apertures, the ions travel through the first apertures and into the epi layer. When the ions penetrate into the epi layer, the local area of the epi layer is doped, forming the first implantation regions. The first implantation regions have a width approximately equal to the width of the apertures in the first blocking mask. For example, in some embodiments, the first implantation region may have a width between approximately 2 μm wide and approximately 7 μm wide. That is, the width of the first implantation region may be approximately 2.0 μm, 2.5 μm, 3.0 μm, 3.5 μm, 4.0 μm, 4.5 μm, 5.0 μm, 5.5 μm, 6.0 μm, 6.5 μm, or 7.0 μm. The first blocking mask is then removed (block 506).

In block 508, a second blocking mask is applied to the top surface of the epi layer. The blocking mask includes second apertures that correspond to the width and locations of the desired second implantation regions, which may be misaligned with and overlapping with the first implantation regions. The second apertures may be the same size as the first apertures, or of a different size than the first apertures. For example, the second apertures may be between approximately 2 μm wide and approximately 7 μm wide. That is, the second apertures may be approximately 2.0 μm, 2.5 μm, 3.0 μm, 3.5 μm, 4.0 μm, 4.5 μm, 5.0 μm, 5.5 μm, 6.0 μm, 6.5 μm, or 7.0 μm wide.

In block 510, a second ion implantation process is used to dope a portion of the epi layer, forming the second implantation regions of a second conductivity type. As with the first ion implantation process, ions are accelerated toward the second blocking mask. Though the blocking mask blocks many of the ions, the ions that travel through the second apertures into the epi layer and dope the local area of the epi layer, forming the second implantation regions. The second implantation regions have a width approximately equal to the width of the apertures in the second blocking mask. For example, in some embodiments, the second implantation region may have a width between approximately 2 μm wide and approximately 7 μm wide. That is, the width of the second implantation region may be approximately 2.0 μm, 2.5 μm, 3.0 μm, 3.5 μm, 4.0 μm, 4.5 μm, 5.0 μm, 5.5 μm, 6.0 μm, 6.5 μm, or 7.0 μm.

The first and second implantation regions overlap one another, forming a connection region extending through the connection region. The width of the connection region may range from approximately 0.5 μm to approximately 4 μm. For example, the width of the connection region may be approximately 0.5 μm, 1.0 μm, 1.5 μm, 2.0 μm, 2.5 μm, 3.0 μm, 3.5 μm, or 4.0 μm. Because the width of the connection region may be less than the minimum aperture width of the first and second blocking masks, the connection region may have a narrower width than connection regions made with a single implantation region, enabling the CB device to reach faster switching speeds. Once the second implantation region has been formed, the second blocking mask is removed (block 512).

Technical effects of the invention include CB device designs that reduce switching losses and increase switching speed of CB devices. In particular, the disclosed CB devices include connection regions made of two misaligned and overlapping implantation regions. The resulting connection region is formed by the overlap of the two implantation regions. The connection region is flanked on two sides by first and second low doped regions where the first and second implantation regions do not overlap. By using two misaligned and overlapping implantation regions, the connection region may be narrower than a similar connection region made with a single implantation using a blocking mask (e.g., hard mask with apertures larger than the resulting connection region). As a result, the disclosed CB devices enable increased switching speeds and reduced switching losses compared to existing CB devices having a connection region with a single implantation region.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method of manufacturing a semiconductor device, comprising:
   performing a first implantation in a semiconductor layer via ion implantation, forming a first implantation region, wherein the semiconductor layer comprises a top epitaxial (epi) layer, wherein the top epi layer is disposed upon at least one epi layer having a first conductivity type that includes a plurality of charge balance (CB) regions having a second conductivity type to form at least one CB layer; and
   performing a second implantation in the semiconductor layer via ion implantation, forming a second implantation region opposite the first implantation region, wherein the first and second implantation regions overlap with one another;

wherein the first and second implantation regions combine to form a connection region extending into the semiconductor layer to at least one of the plurality of CB regions of the at least one CB layer.

2. The method of claim 1, wherein the connection region extends a depth is greater than 3 microns.

3. The method of claim 1, comprising:
applying a first blocking mask to a top surface of the semiconductor layer, wherein the first blocking mask comprises a first set of one or more features; and
removing the first blocking mask from the top surface of the semiconductor layer after the first implantation has been performed.

4. The method of claim 3, comprising:
applying a second blocking mask to the top surface of the semiconductor layer, wherein the second blocking mask comprises a second set of one or more features; and
removing the second blocking mask from the top surface of the semiconductor layer after the second implantation has been performed.

5. The method of claim 4, wherein the first and second blocking masks are each more than 4 microns thick, and wherein each of the features in the first and second sets of one or more features have a width of less than 5 microns.

6. The method of claim 1, comprising:
applying a first blocking mask to a top surface of the semiconductor layer, wherein the first blocking mask comprises a first set of one or more features; and
applying a second blocking mask on top of the first blocking mask, wherein the second blocking mask comprises a second set of one or more features, and wherein the second set of one or more features overlap with the first set of one or more features.

7. The method of claim 6, comprising removing the first and second blocking masks from the top surface of the semiconductor layer after ion implantation.

8. The method of claim 1, wherein the first implantation region is of the second conductivity type and the second implantation region is of the second conductivity type.

9. The method of claim 1, wherein the connection region is of the first conductivity type and the first and second implantation regions are of the second conductivity type.

10. The method of claim 1, wherein the semiconductor device comprises a silicon carbide (SiC) semiconductor device.

11. A charge balanced (CB) device, comprising:
a device layer having a first conductivity type, wherein the device layer comprises a top region having a second conductivity type disposed in a top surface of the device layer;
a first CB layer having the first conductivity type disposed adjacent to the device layer, wherein the first CB layer comprises a first plurality of CB regions having the second conductivity type;
a first connection region comprising a connection region wherein a first implantation region and a second implantation region overlap with one another;
the first implantation region formed by a first implantation adjacent the connection region; and
the second implantation region formed by a second implantation adjacent the connection region, opposite the first implantation region;
wherein the first connection region extends from the top region of the device layer to at least a first CB region of the first plurality of CB regions of the first CB layer.

12. The CB device of claim 11, wherein the connection region is of the second conductivity type and the first and second implantation regions are of the second conductivity type.

13. The CB device of claim 11, wherein the connection region has a width of between approximately 0.5 µm and 4 µm.

14. The CB device of claim 13, wherein a dopant concentration of the connection region is between approximately $0.5 \times 10^{16}$ cm$^{-3}$ and $5 \times 10^{16}$ cm$^{-3}$.

15. The CB device of claim 11, comprising a second connection region extending from the top region of the device layer to at least a second CB region of the first plurality of CB regions.

16. The CB device of claim 11, wherein the first implantation region is of the second conductivity type and the second implantation region is of the first conductivity type.

17. The CB device of claim 11, wherein the device layer and the CB layer are fabricated from silicon carbide (SiC).

18. The CB device of claim 11, wherein the CB device is a metal-oxide-semiconductor field-effect transistor (MOSFET), a junction field effect transistors (JFET), a bipolar junction transistors (BJT), an insulated gate bipolar transistors (IGBT), or a diode.

19. A charge balanced (CB) device, comprising:
at least one epitaxial (epi) layer having a first conductivity type that includes a plurality of charge balance (CB) regions having a second conductivity type to form at least one charge balance (CB) layer, wherein a thickness of each of the plurality of CB regions is less than a thickness of the at least one CB layer;
a top epitaxial layer having the first conductivity type disposed adjacent to the at least one CB layer to form a device layer, wherein the device layer includes a top region having the second conductivity type; and
a connection region comprising a connection region where a first implantation region and a second implantation region overlap with one another;
a first region formed by the first implantation region adjacent the connection region; and
a second region formed by the second implantation region adjacent the connection region, opposite the first region;
wherein the connection region extends from the top region of the device layer to at least one of the plurality of CB regions of the at least one CB layer.

20. The CB device of claim 19, wherein the connection region has a width of between approximately 0.5 µm and 4 µm, and a dopant concentration between approximately $0.5 \times 10^{16}$ cm$^{-3}$ and $5 \times 10^{16}$ cm$^{-3}$.

21. The CB device of claim 19, wherein the first implantation region is of the second conductivity type and the second implantation region is of the second conductivity type.

22. The CB device of claim 19, wherein the device layer and the CB layer are fabricated from silicon carbide (SiC).

23. The CB device of claim 19, wherein the CB device is a metal-oxide-semiconductor field-effect transistor (MOSFET), a junction field effect transistors (JFET), a bipolar junction transistors (BJT), an insulated gate bipolar transistors (IGBT), or a diode.

24. The CB device of claim 19, wherein the first and second implantation regions are formed by introducing one or more dopants into the at least one epi layer using high energy ion implantation.

25. The CB device of claim 19, wherein the first and second implantation regions are formed by introducing dopants injected with implant acceleration energies between approximately 500 keV and approximately 85 MeV.

* * * * *